(12) United States Patent
Chen et al.

(10) Patent No.: US 6,897,174 B2
(45) Date of Patent: May 24, 2005

(54) DIELECTRIC MATERIAL COMPOSITIONS

(75) Inventors: Li-Mei Chen, Hsinchu (TW); Chao-Jen Wang, Kaohsiung (TW); Chuan-Ya Hung, Yunlin (TW)

(73) Assignee: Industrial Technology Research Institute (TW)

( * ) Notice: Subject to any disclaimer, the term of this patent is extended or adjusted under 35 U.S.C. 154(b) by 31 days.

(21) Appl. No.: 10/606,966

(22) Filed: Jun. 27, 2003

(65) Prior Publication Data

US 2004/0089854 A1 May 13, 2004

(30) Foreign Application Priority Data

Nov. 8, 2002 (TW) .......................................... 91132925 A

(51) Int. Cl.$^7$ ............................................. C04B 35/505
(52) U.S. Cl. ........................ 501/152; 501/134; 501/135; 252/62.9 R; 252/62.9 PZ
(58) Field of Search ................................. 501/155, 134, 501/135, 152; 252/62.9 R, 62.9 PZ

(56) References Cited

U.S. PATENT DOCUMENTS

| 5,138,520 | A | | 8/1992 | McMillan et al. |
| 5,508,242 | A | * | 4/1996 | Baumard et al. ........... 501/152 |
| 5,625,587 | A | * | 4/1997 | Peng et al. .................. 365/145 |
| 5,919,515 | A | | 7/1999 | Yano et al. |
| 5,955,213 | A | | 9/1999 | Yano et al. |
| 5,985,404 | A | | 11/1999 | Yano et al. |
| 6,231,991 | B1 | * | 5/2001 | Maloney ...................... 428/469 |
| 6,245,451 | B1 | * | 6/2001 | Kamisawa et al. ......... 428/697 |
| 6,835,684 | B2 | * | 12/2004 | Tietz et al. ................. 501/134 |

FOREIGN PATENT DOCUMENTS

JP  2002-326860  * 11/2002

* cited by examiner

*Primary Examiner*—Karl Group
(74) *Attorney, Agent, or Firm*—Sughrue Mion, PLLC

(57) ABSTRACT

A dielectric material composition including a metal oxide represented by a general formula, $Y_{1-x}M^1_x Mn_{1-y}M^2_y O_m$. $M^1$ is Y, Ho, Er, Yb, Tm, or Lu. $M^2$ is Ti, Zr, V, Mo, Mg, Cu, or Zn. X is a number of 0 to 1. Y is a number of 0 to 1. The metal oxide is of high dielectric constant and has the properties of ferroelectricity, piezoelectricity, and pyroelectricity.

15 Claims, 2 Drawing Sheets

DIELECTRIC MATERIAL COMPOSITIONS

BACKGROUND OF THE INVENTION

1. Field of the Invention

The present invention relates to a novel dielectric material composition which comprises a metal oxide having a high dielectric constant and the properties of ferroelectricity, piezoelectricity, and pyroelectricity. The dielectric material composition can be applied in a wide range of various fields such as memory devices, microwave devices, sensors, microelectromechanical devices, and optoelectric devices.

2. Description of the Related Art

Some single crystal or poly-crystal metal oxides, such as $BaTiO_3$, $LiNbO_3$, $Pb(Zr,Ti)O_3$, and $(Sr,Ba)Nb_2O_6$, have ferroelectric properties and are widely applied in electronic, optoelectric, non-linear optical, and piezoelectric devices, such as optical waveguides, optical modulators, ferroelectric thin film optical memory and displays, electroacoustic transducers, high frequency surface(bulk) acoustic wave devices, infrared sensors, ferroelectric nonvolatile memory devices.

There are three types of dielectric materials having ferroelectric properties. The first type has a pervoskite structure with a general formula $ABO_3$, wherein $BaTiO_3$ is a representative type. The second type is tungsten bronze material, such as SBN $((Ba,Sr)Nb_2O_6)$ and PBN$((Ba,Pb)Nb_2O_6)$. The third type is $YMnO_3$ type material with a general formula $RMnO_3$ having a hexagonal or rhombic crystalline structure, wherein R is a metal selected from rare earth elements, such as scandium (Sc) and Yttrium (Y). For example, $YMnO_3$, $HoMnO_3$, $ErMnO_3$, $YbMnO_3$, $TmMnO_3$, $LuMnO_3$ and solid solutions thereof are hexagonal crystals having ferroelectric properties. The current ferroelectric materials of interest, PZT and SBT, are classified as the first type, or pervoskite structure, and have advantageous and disadvantageous properties. PZT has a relatively low process temperature and a high remnant polarization (PZT: 600~700° C./15~30 $\mu C/cm^2$ versus SBT: 750~800° C./5~10 $\mu C/cm^2$), but SBT has a relatively low coercive field and a good fatigue resistance (PZT: 50~70 kv/cm versus SBT: 30~50 kv/cm). Accordingly, it is necessary to develop a ferroelectric material composition having a new structure and the same advantages as PZT and SBT, for the exploitation of applicable range and field. There are many investigations directed to the adjustment of the $ABO_3$ pervoskite structure utilizing the theory of valence change and the principle of electrical neutrality. The examples are $A^{1+}B^{5+}O_3$, $A^{2+}B^{4+}O_3$, $A^{3+}B^{3+}O_3$, $A_xBO_3$, $A(B'_{0.67}B''_{0.33})O_3$, $A(B'_{0.33}B''_{0.67})O_3$, $A(B_{0.5}^{+3}B_{0.5}^{+5})O_3$, $A(B_{0.5}^{2+}B_{0.5}^{6+})O_3$, $A(B_{0.5}^{1+}B_{0.5}^{7+})O_3$, $A^{3+}(B_{0.5}^{2+}B_{0.5}^{4+})O_3$, $A(B_{0.25}^{1+}B_{0.75}^{5+})O_3$, $A(B_{0.5}^{3+}B_{0.5}^{4+})O_{2.75}$, and $A(B_{0.5}^{2+}B_{0.5}^{5+})O_{2.75}$. Nevertheless, the adjustments for the third type of ferroelectric materials mentioned above are mostly directed to R in $RMnO_3$, rarely to Mn.

U.S. Pat. No. 5,919,515 discloses a method for preparing a ferroelectric film formed on a substrate, the ferroelectric film having a $YMnO_3$ hexagonal crystal structure of, and composed mainly of manganese, oxygen and at least one element selected from the group consisting of rare earth elements, scandium and yttrium.

U.S. Pat. No. 5,985,404 discloses a ferroelectric recording medium for recording information by utilizing the polarization reversal of a ferroelectric material, comprising a ferroelectric layer of a pervoskite material, a tungsten bronze material, or an oxide material containing a rare earth element (inclusive of scandium and yttrium), manganese and oxygen and having a hexagonal $YMnO_3$ crystalline structure.

U.S. Pat. No. 5,955,213 discloses a ferroelectric thin film formed on a substrate, wherein the film has an $AMnO_3$ hexagonal crystal structure and comprises manganese, oxygen, and element A, wherein element A is selected from the group consisting of a rare earth element, scandium, and yttrium.

U.S. Pat. No. 5,138,520 describes a general composition of $ABO_3$ which includes $PbTiO_3$, $Pb_xZr_xTiO_3$, $Pb_xLa_yZr_zTiO_3$, and $YMnO_3$ where Y represents any rare-earth element, and $TiYMnO_3$.

The metal oxides in the patents mentioned above are different from $Y_{1-x}M^1{}_xMn_{1-y}M^2{}_yO_m$ of the present invention.

SUMMARY OF THE INVENTION

Accordingly, an object of the invention is to provide a novel dielectric material composition, comprising a metal oxide represented by a general formula of $Y_{1-x}M^1{}_x Mn_{1-y}M^2{}_yO_m$. The metal oxide has a high dielectric constant and possesses the properties of ferroelectricity, piezoelectricity, and pyroelectricity.

The metal oxide in the present dielectric material composition is $Y_{1-x}M^1{}_xMn_{1-y}M^2{}_yO_m$, a tertiary or quaternary metallic oxide, developed from $YMnO_3$, a binary metallic oxide. The adjustment and replacement of Mn is a unique innovation, and thereby a dielectric material with good properties, such as low process temperature, high coercive field, and high fatigue resistance can be obtained and is suitable for ferroelectric optical memory devices, piezoelectric thin films, transducers, optical storage elements, and nonvolatile memory devices.

The present dielectric material composition can be utilized in the form of ceramic bulk or thin film and has a wide range of usage.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
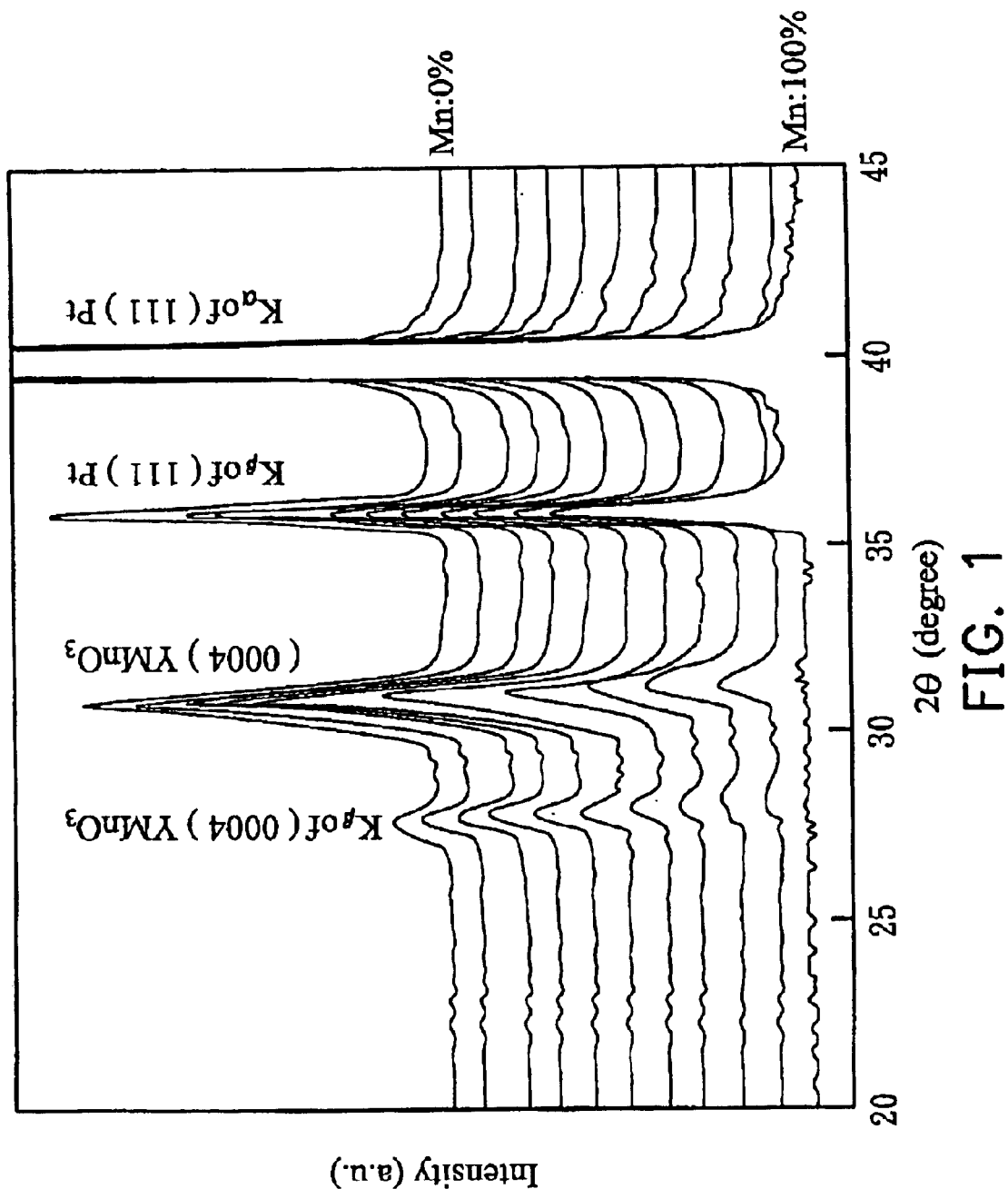
FIG. 1 shows the X-ray diffractogram of the $Y(Mn_{1-y}Ti_y)O_3$ film obtained from Example 1 of the present invention.

The metal oxide in the present dielectric material composition has a general formula $Y_{1-x}M^1{}_xMn_{1-y}M^2{}_yO_m$, which is mainly formed by means of adjusting the $YMnO_3$ structure according to the theory of valence change and the principle of electrical neutrality. $M^1$ may be a rare earth element, such as Y, Ho, Er, Yb, Tm, or Lu, preferably Y, Er, and Yb, and more preferably Y. $M^2$ may be an element of Ti, Zr, V, Cr, Mo, Mg, Cu, or Zn, preferably Ti, La, Ce, Cr, and V, and more preferably Ti. x is a number of 0 to 1, and preferably 0 to 0.1. y is a number of 0 to 1, and preferably 0.35 to 0.65. The valence of Mn may be 2, 3, 4, or 7. The valence of Ti may be 2, 3, or 4. The valence of V may be 2, 3, 4, or 5. The valence of Cr may be 2, 3, or 6. The valence of Yb may be 2 or 3. The valences of Y, Ho, Er, Tm, and Lu are 3. The valence of Zr is 4. The valence of Mo is 6. The valences of Mg and Zn are 2. The valence of Cu may be 1 or 2. The valence of Ce may be 3 or 4. The value of m satisfies the principle of electrical neutrality for the metal oxide.

The properties of ferroelectric thin films are generally related to the displacement of a domain wall. When the external electric field is applied, the effect of external electric field and frequency is remarkably apparent. Additionally, because ferroelectric material has an asymmetric structure, the coordination number, structural distortion and defect, and oxygen defect can adversely affect the ferroelectric properties. Ferroelectric hysteresis loop and loss tend to be influenced by internal friction, structural distortion, defect polarization, and domain wall displacement within the structure and interactions among different mechanisms. For example, introducing metal atoms having different valences will change the oxygen vacancies in the structure. It is reported in literatures that polarization fatigue and electric leakage are greatly related to the accumulation of oxygen vacancies between the thin film and the electrode or in the interior of the thin film. Additionally, oxygen vacancies also result in a local structure distortion and damage, and this, in turn, results in the accumulation of electric charges within the thin film; therefore the ferroelectric properties are altered. Furthermore, the radius of the new metal ion which replaces the centered or corner original metal ion is different from the original metal ion, resulting in the distortion of the structure, and thus the related properties are altered. A multi-metal oxide formed by the addition of a metal ion having a relatively lower valence in the original structure is known as "acceptor type". The resulting defects of oxygen vacancies very easily diffused even at a temperature less than Curie temperature. The defect polarization arisen from such oxygen vacancies and $M^2$ alters the dielectric properties. A multi-metal oxide formed by the addition of metal ions having relatively more valences in the original structure is known as "donor type". There are increased metal atom vacancies in the structure. The resulting defect polarization also alters the dielectric properties. The move for metal atom vacancies is more difficult than the move for oxygen vacancies; thus the metal atom vacancies and the oxygen vacancies possess different influences on ferroelectric properties. The above described concept is utilized in the present invention to find a quaternary metallic oxide for improving the ferroelectric properties, wherein the domain wall is adjusted through the variation of structure and coordination number and hence the resulting crystal defect and oxygen vacancy, and this in turn effects the ferroelectric hysteresis loop and the loss, obtaining a dielectric material with desired properties.

The present metal oxide in the dielectric material composition has a high dielectric constant and the properties of ferroelectricity, piezoelectricity, and pyroelectricity. The dielectric constant is about 10~400, preferably 300~400. The Q factor is about 400~700, preferably 600~700. The extent of polarization and the equivalent dielectric constant for ferroelectricity increase as the replaced amount of Mn by Ti increases. The most preferred replacement ratio is 65%, based on the original amount of manganese.

Therefore, the present dielectric material composition is suitable for ferroelectric memory devices, piezoelectric thin films, transducers, optical storage elements, and nonvolatile memory devices.

The metal oxide in the present dielectric material composition can be prepared by means of solid state reactions or liquid phase reactions.

The suitable methods of solid state reactions can be exemplified by (but not limited to) cofire ceramic, magnetron sputtering, and ion beam plating. Useful starting materials may be corresponding singly metallic oxides, such as powder or target material of $Y_2O_3$, $MnO_2$, and $TiO_2$, the corresponding fluoride, such as powder or target material of $YF_3$, $MnF_4$, and $TiF_4$, or the corresponding single component of metal targets. The follow-up calcination is accomplished in an atmosphere of oxygen, in order to form the oxide. When the metal oxide in the present invention is prepared from a solid state reaction, the calcination temperature for forming the form of bulk material may be 1100~1200° C., and the sintering temperature may be 1200~1300° C. For forming the form of thin film, 700~900° C. of temperature is used.

The suitable methods of liquid phase reaction are exemplified by (but are not limited to) sol-gel, co-precipitation, spray, and hydrothermal methods. Useful starting materials may be the alkoxides, carbonates, nitrates, acetates, acetylacetonates, or chlorides of the corresponding single metal element, such as $Ti(OC_4H_9)_4$, manganese acetate tetrahydrate, and yttrium acetate tetrahydrate. When the metal oxide in the present invention is prepared from a liquid phase reaction, the process temperature may be further reduced to less than 650° C.

The process temperature for solid state reaction is relatively high, because sufficient energy is demanded for accomplishing the heat diffusion of the different atoms from more than 4 components to form a uniform component structure; nevertheless, when using a method of liquid phase reaction, as long as appropriate precursors have been selected, material having a multi-component distribution can be synthesized at a time with an array reactor. Additionally, because the admixture in a molecular order is much more uniform than in a solid state reaction, the process temperature to form powder or thin films is reduced.

EXAMPLES

Example 1

Preparation of Metal Oxide Film of Formula $YMn_{1-x}Ti_xO$

The preparation of metal oxide film of the formula $YMn_{1-x}Ti_xO$ was performed by ion-beam sputtering. The starting materials were the corresponding single component metal targets. Beam current was 40~60 mA. The substrate was a structure of Pt/Si. After sputtering each metal target for specific time according to the desired stoichiometry and deposition rate respectively, an annealing treatment at 400° C. for 80 hrs and a thermal treatment for crystallization at 870° C. for 3 hrs were performed, yielding a product. The peak standing for (0004) a plane of the crystalline structure had increased intensity as observed by X-ray diffractogram. See FIG. 1.

The dielectric loss (tan δ) was determined at a frequency of 2.5 GHz. Quality factor, Q, was more than 450, and optimally 650, when x=0.1~0.7. Q herein was 1/tan δ.

Example 2

Preparation of Metal Oxide Bulk of Formula $YMn_{1-x}Ti_xO$

Figure 2:
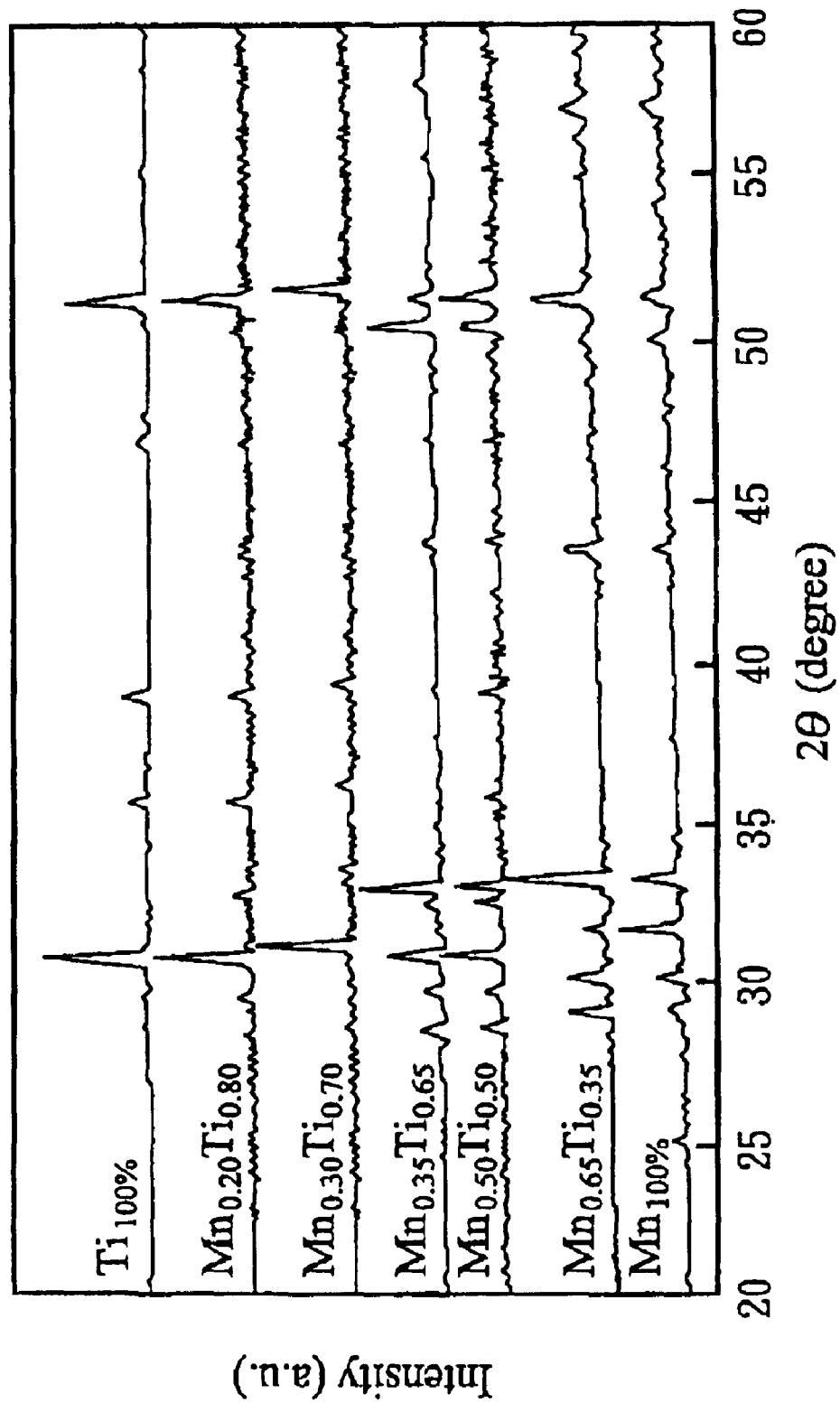
FIG. 2 shows the X-ray diffractogram of the $Y(Mn_{1-y}Ti_y)O_3$ bulk obtained from Example 2 of the present invention.

The raw materials of high purity $Y_2O_3$, $MnO_2$, and $TiO_2$ powder in an amount of desired stoichiometry, respectively, were ball milled, calcined at 1150° C. for 12 hrs, and sintered at 1300° C. for 12 hrs, yielding a bulk product. The X-ray diffractograms of the various bulk products of different compositions were observed, as shown in FIG. 2, wherein x is 0, 0.35, 0.5, 0.65, 0.9, and 1, respectively. On the premise that no other crystal phase existed in the bulk product, Ti could replace up to 65% of Mn, and the crystal structure was hexagonal.

Test specimens, each having 1 mm of thickness, were made from the above obtained bulk products, and the ferroelectric hysteresis properties were determined by Radiant RT-66A. It was found that the extent of polarization (with a maximal electric field being about $2.5 \times 10^{-1}$ kV/cm) and equivalent dielectric constant increased as the replaced amount of Mn by Ti increased. The most preferred replacement ratio of Mn by Ti was 65%.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dielectric material composition, comprising a metal oxide having a formula of:

$$Y_{1-x}M^1{}_xMn_{1-y}M^2{}_yO_m,$$

wherein $M^1$ is Ho, Er, Yb, Tm, or Lu;

$M^2$ is Ti, Zr, V, Mo, Mg, Cu, La, Ce, Cr, or Zn;

x is a number of 0 to 1;

y is a number greater than 0 and less than 1; and m satisfies the principle of electrical neutrality for the metal oxide.

2. The dielectric material composition as claimed in claim 1, wherein $M^1$ is Er or Yb.

3. The dielectric material composition as claimed in claim 1, wherein $M^2$ is Ti, La, Ce, Cr, or V.

4. The dielectric material composition as claimed in claim 3, wherein $M^2$ is Ti.

5. The dielectric material composition as claimed in claim 1, wherein x is a number of 0 to 0.1.

6. A dielectric material composition, comprising a metal oxide having a formula of:

$$Y_{1-x}M^1{}_xMn_{1-y}M^2{}_yO_m,$$

wherein $M^1$ is Ho, Er, Yb, Tm, or Lu;

$M^2$ is Ti, Zr, V, Mo, Mg, Cu, La, Ce, Cr, or Zn;

x is a number of 0 and 1;

y is a number of 0.35 to 0.65; and m satisfies the principle of electrical neutrality for the metal oxide.

7. A dielectric material composition, comprising a metal oxide having a formula of:

$$YMn_{1-y}Ti_yO_m.$$

wherein y is a number of 0.35 to 0.65; and m satisfies the principle of electrical neutrality for the metal oxide.

8. The dielectric material composition as claimed in claim 1, wherein the dielectric material composition is manufactured from a method of solid state reaction.

9. The dielectric material composition as claimed in claim 1, wherein the dielectric material composition is manufactured from a method of liquid phase reaction.

10. The dielectric material composition as claimed in claim 1, wherein the dielectric material composition is in a bulk form.

11. The dielectric material composition as claimed in claim 1, wherein the dielectric material composition is in a film form.

12. The dielectric material composition as claimed in claim 1, wherein the dielectric constant of the dielectric material composition is more than 29.

13. The dielectric material composition as claimed in claim 12, wherein the dielectric constant of the dielectric material composition is more than 350.

14. The dielectric material composition as claimed in claim 1, wherein the quality factor of the dielectric material composition is more than 450.

15. The dielectric material composition as claimed in claim 14, wherein the quality factor of the dielectric material composition is more than 650.

* * * * *